(12) United States Patent
Hasegawa et al.

(10) Patent No.: US 8,866,279 B2
(45) Date of Patent: Oct. 21, 2014

(54) SEMICONDUCTOR DEVICE

(71) Applicant: Panasonic Corporation, Osaka (JP)

(72) Inventors: Yuu Hasegawa, Kagoshima (JP); Tooru Aoyagi, Kagoshima (JP); Kenichi Ito, Osaka (JP); Toshiyuki Fukuda, Kyoto (JP); Kiyoshi Fujihara, Hyogo (JP); Masanori Nishino, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/746,807

(22) Filed: Jan. 22, 2013

(65) Prior Publication Data
US 2013/0127034 A1 May 23, 2013

Related U.S. Application Data

(63) Continuation of application No. PCT/JP2011/003818, filed on Jul. 4, 2011.

(30) Foreign Application Priority Data

Jul. 27, 2010 (JP) ................................. 2010-168465

(51) Int. Cl.
*H01L 23/495* (2006.01)
*H01L 23/047* (2006.01)
*H01L 23/498* (2006.01)
*H01L 33/48* (2010.01)
*H01L 27/146* (2006.01)
*H01L 33/62* (2010.01)
*H01L 23/00* (2006.01)

(52) U.S. Cl.
CPC ......... *H01L 23/49575* (2013.01); *H01L 33/486* (2013.01); *H01L 2224/48091* (2013.01); *H01L 2224/48247* (2013.01); *H01L 27/14618* (2013.01); *H01L 33/62* (2013.01); *H01L 23/49548* (2013.01); *H01L 23/047* (2013.01); *H01L 24/48* (2013.01); *H01L 23/49861* (2013.01)
USPC ........... 257/676; 257/666; 257/672; 257/673; 257/690; 257/692; 257/734; 257/748

(58) Field of Classification Search
CPC ........................ H01L 23/495; H01L 23/49575
USPC .......... 257/676, 666, 672, 673, 692, 734, 748
See application file for complete search history.

(56) References Cited

U.S. PATENT DOCUMENTS

| | | | |
|---|---|---|---|
| 2002/0064903 A1* | 5/2002 | Kawata et al. | 438/107 |
| 2005/0280017 A1 | 12/2005 | Oshio et al. | |
| 2007/0008862 A1* | 1/2007 | Fujihara et al. | 369/122 |

(Continued)

FOREIGN PATENT DOCUMENTS

| | | |
|---|---|---|
| JP | 2005-39100 | 2/2005 |
| JP | 2008-177496 | 7/2008 |
| JP | 2008-251937 | 10/2008 |

OTHER PUBLICATIONS

International Search Report of PCT Application No. PCT/JP2011/003818 dated Oct. 4, 2011.

*Primary Examiner* — Chuong A Luu
(74) *Attorney, Agent, or Firm* — McDermott Will & Emery LLP

(57) ABSTRACT

A semiconductor device includes: a lead frame; a semiconductor element held by the lead frame; a frame body which is formed on the lead frame to surround the semiconductor element, cover a side surface of the lead frame, and expose a bottom surface of the lead frame; and a protective resin filling a region surrounded by the frame body. The lead frame includes an uneven part formed in a section which is part of an upper surface of the lead frame, and is covered with the frame body.

20 Claims, 6 Drawing Sheets

(56) References Cited

U.S. PATENT DOCUMENTS

| | | |
|---|---|---|
| 2008/0237627 A1 | 10/2008 | Kobayakawa |
| 2010/0330714 A1* | 12/2010 | Jung et al. ............. 438/26 |
| 2011/0292302 A1* | 12/2011 | Park et al. ............. 348/739 |
| 2012/0025361 A1* | 2/2012 | Ito et al. ............. 257/676 |
| 2012/0108013 A1* | 5/2012 | Fujisawa et al. ............. 438/123 |
| 2014/0008695 A1* | 1/2014 | Kobayakawa ............. 257/99 |

* cited by examiner

SEMICONDUCTOR DEVICE

CROSS-REFERENCE TO RELATED APPLICATIONS

This is a continuation of International Application No. PCT/JP2011/003818 filed on Jul. 4, 2011, which claims priority to Japanese Patent Application No. 2010-168465 filed on Jul. 27, 2010. The entire disclosures of these applications are incorporated by reference herein.

BACKGROUND

The present disclosure relates to semiconductor devices, and specifically to a surface mount type semiconductor device.

In recent years, light emitting devices including semiconductor elements such as light emitting diodes (LEDs) have been used in many lighting apparatuses. In particular, light emitting devices using LEDs in combination with fluorescent materials which absorbs light emitted from the LEDs and converts the absorbed light to light having another wavelength to emit white light have been widely developed, and have been commercialized. As backlight sources of liquid crystal panels of flat liquid crystal television sets, light emitting devices capable of emitting white light are becoming increasingly common.

The light emitting devices have been required not only to be downsized, long-life, and low power consumption, but also to achieve high luminance. In order to achieve both a reduction in size and an increase in luminance, packages allowing both a reduction in size and thickness and an enhancement in efficiency of heat dissipation are required. In order to allow both the reduction in size and thickness and the enhancement in efficiency of heat dissipation of the packages, it has been proposed to expose a back surface of a lead frame provided with a semiconductor element (see, for example, Japanese Patent Publication No. 2008-251937). Exposing the back surface of the lead frame allows heat to efficiently dissipate from the lead frame to a mounting substrate, and thus it is possible to obtain a light emitting device with high luminance.

SUMMARY

However, the conventional light emitting device has the following problems. The conventional light emitting device holds a lead frame by grasping a small thin portion of the lead frame by a resin case. Thus, a protective resin filling the resin case may leak along a bonded interface between the resin case and the lead frame to a terminal section or a back surface of the lead frame. Due to stress applied in separating individual packages from a multiple lead frame arrangement, heat used in mounting the separated packages to a mounting substrate by soldering, etc., adherence between the resin case and the lead frame may be reduced, or the resin case may be detached from the lead frame, so that long-term liability cannot be ensured.

Such problems may also arise in semiconductor devices other than light emitting devices. For example, light receiving devices used in light receiving sections of optical disk systems for high-density recording are required to be downsized. On the other hand, the light receiving devices have to receive returning light of a laser beam having high luminance, and thus heat dissipation characteristics of the light receiving devices are also required to be improved. Moreover, semiconductor devices including infrared ray sensor elements, etc. are also required to be downsized and to have improved heat dissipation characteristics. In such semiconductor devices which are required both to be downsized and to have improved heat dissipation characteristics, problems similar to those in the light emitting devices may arise.

In one general aspect, the instant application describes a semiconductor device which has both a reduced size and improved heat dissipation characteristics, wherein leakage of a resin, detachment of a package, etc. are less likely to occur to ensure long-term reliability.

According to the one general aspect, the semiconductor device of the present disclosure includes an uneven part formed at an outer edge portion of the lead frame.

Specifically, an example semiconductor device includes: a lead frame; a semiconductor element held by the lead frame; a frame body formed on the lead frame to surround the semiconductor element, cover a side surface of the lead frame, and expose a bottom surface of the lead frame; and a protective resin filling a region surrounded by the frame body, wherein the lead frame includes an uneven part formed in a section which is part of an upper surface of the lead frame and is covered with the frame body.

The example semiconductor device includes the uneven part formed in the section which is part of the upper surface of the lead frame, and is covered with the frame body. With this configuration, the contact area between the lead frame and the frame body is increased, and the adherence between the lead frame and the frame body is improved. Moreover, at an interface between the lead frame and the frame body, an obstacle can be provided on a passage along which the protective resin moves, and thus it is possible to reduce leakage of the protective resin along the interface between the lead frame and the frame body.

In the example semiconductor device, the uneven part may include a plurality of first ridges linearly extending in a first direction, and a plurality of second ridges linearly extending in a second direction which crosses the first direction.

In the example semiconductor device, the lead frame may include an external terminal protruding outside the frame body, and the plurality of first ridges and the plurality of second ridges may have a greater height, a larger width, or a narrower interval in a region of the lead frame under a position at which the frame body is in contact with the external terminal than in the other region of the lead frame.

In the example semiconductor device, the lead frame may include a barrier portion which extends along an outer edge portion of the lead frame, and is raised from an upper surface of the lead frame.

In the example semiconductor device, the lead frame may include a die pad section, and a lead section isolated from the die pad section, the die pad section includes an element mounting section to which the semiconductor element is mounted, a first external terminal which is formed at an edge opposite to the element mounting section, and protrudes outside the frame body, a first constricted section which is formed between the element mounting section and the external terminal, and has a smaller width than the other sections of the die pad section, and a first through hole formed in the first constricted section, the lead section includes a wire connection section connected to the semiconductor element via a wire, a second external terminal which is formed at an edge opposite to the wire connection section, and protrudes outside the frame body, a second constricted section which is formed between the wire connection section and the external terminal, and has a smaller width than the other sections of the lead section, and a second through hole formed in the second constricted section, and the frame body may be formed on the first constricted section and the second constricted section to fill the first through hole and the second through hole.

In the example semiconductor device, an outer edge portion of the element mounting section and an outer edge portion of the wire connection section may be thin portions having smaller thicknesses than the other portions of the lead frame.

In the example semiconductor device, the first external terminal may have a smaller width than the element mounting section, and the second external terminal may have a smaller width than the wire connection section.

In the example semiconductor device, the uneven part may include grooves each having a shape of a ring or a polygon when viewed from above. In this case, the grooves may be arranged in a staggered manner or in a grid pattern.

The semiconductor device of the present disclosure has both a reduced size and improved heat dissipation characteristics, wherein leakage of a resin and detachment of a package are less likely to occur, and thus long-term reliability can be ensured.

BRIEF DESCRIPTION OF THE DRAWINGS

FIGS. 1A-1C are views illustrating a semiconductor device according to an embodiment, wherein FIG. 1A is a plan view, FIG. 1B is a cross-sectional view along the line Ib-Ib of FIG. 1A, and FIG. 1C is a bottom view.

FIGS. 3A and 3B are views illustrating an example uneven part, wherein FIG. 3A is a plan view, and FIG. 3B is a cross-sectional view along the line of FIG. 3A.

FIGS. 4A and 4B are views illustrating an example uneven part, wherein FIG. 4A is a plan view, and FIG. 4B is a cross-sectional view along the line IVb-IVb of FIG. 4A.

FIGS. 5A and 5B are views illustrating an example uneven part, wherein FIG. 5A is a plan view, and FIG. 5B is a cross-sectional view along the line Vb-Vb of FIG. 5A.

FIGS. 6A and 6B are views illustrating an example uneven part, wherein FIG. 6A is a plan view, and FIG. 6B is a cross-sectional view along the line VIb-VIb of FIG. 6A.

FIGS. 8A-8D are views illustrating variations of the semiconductor device of the embodiment, wherein FIG. 8A is a plan view, FIG. 8B is a cross-sectional view along the line VIIIb-VIIIb of FIG. 8A, FIG. 8C is a cross-sectional view along the line VIIIc-VIIIc of FIG. 8A, and FIG. 8D is a bottom view.

DETAILED DESCRIPTION

Figure 1A:
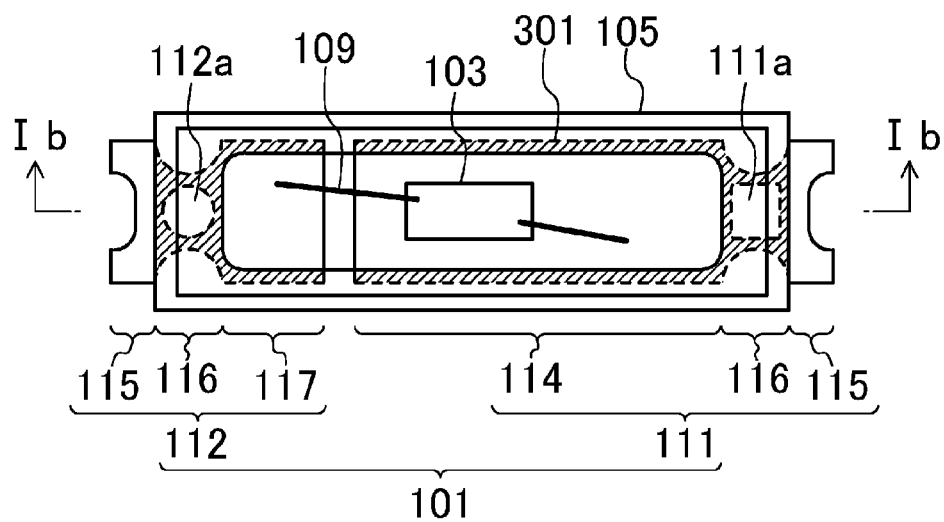
Figure 1B:
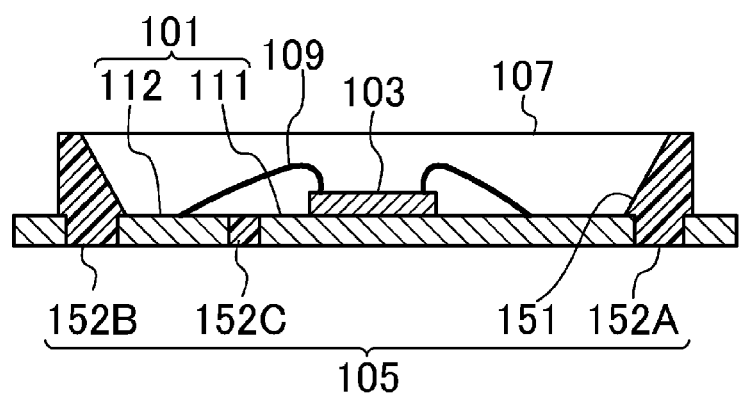
Figure 1C:
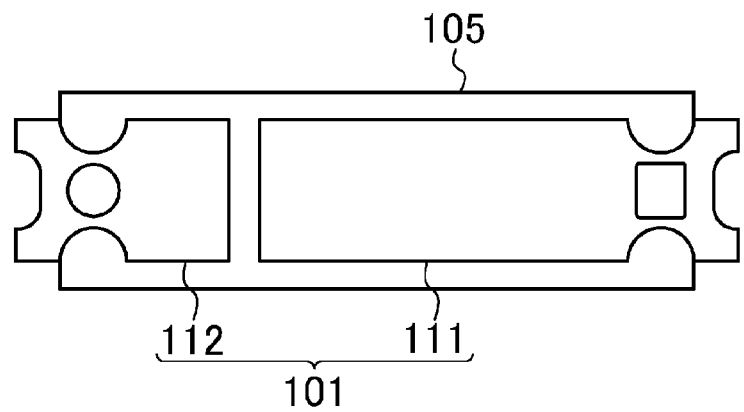

As illustrated in FIGS. 1A-1C, a semiconductor device according to an embodiment includes a lead frame 101, a semiconductor element 103 held on the lead frame 101, a frame body 105 formed on the lead frame 101 to surround the semiconductor element 103, and a protective resin 107 filling a region surrounded by the frame body 105. In the present embodiment, the semiconductor element 103 is described as a light emitting diode (LED), but the semiconductor element 103 is not particularly limited to the present embodiment.

The lead frame 101 is made of, for example, a copper (Cu) base alloy having a thickness of about 0.15-0.3 mm, and an upper surface, a bottom surface, and the like of the lead frame 101 are generally covered with a plating layer (not shown). The lead frame 101 includes a die pad section 111 in which the semiconductor element 103 is mounted, and a lead section 112 separated from the die pad section 111. The die pad section 111 includes an element mounting section 114 which is located in the region surrounded by the frame body 105, and in which the semiconductor element is mounted, and an external terminal 115 protruding outside the frame body 105. A constricted section 116 having a smaller width than the element mounting section 114 and the external terminal 115 is formed between the element mounting section 114 and the external terminal 115, and a through hole 111a is formed in the constricted section 116. The lead section 112 includes a wire connection section 117 which is located in the region surrounded by the frame body 105, and to which a wire 109 is connected, and an external terminal 115 protruding outside the frame body 105. A constricted section 116 having a smaller width than the wire connection section 117 and the external terminal 115 is formed between the wire connection section 117 and the external terminal 115, and a through hole 112a is formed in the constricted section 116.

The frame body 105 is made of, for example, a resin, and includes a wall portion 151 surrounding an outer edge portion of the lead frame 101, a buried portion 152A buried in the through hole 111a of the die pad section 111, a buried portion 152B buried in the through hole 112a of the lead section 112, and a buried portion 152C buried in a gap between the die pad section 111 and the lead section 112. The wall portion 151 is integrally formed with the buried portion 152A and the buried portion 152B. In the present embodiment, the frame body 105 is formed to cover side surfaces of the lead frame 101 and expose the bottom surface of the lead frame 101. Moreover, an outer circumference of the wall portion 151 has the shape of a rectangle when viewed from above, and from one short side of the wall portion 151, the external terminal 115 of the die pad section 111 protrudes outside the frame body 105, and from the other short side, the external terminal 115 of the lead section 112 protrudes outside the frame body 105.

A method for fabricating the frame body 105 may be, but not particularly limited to, commonly used insert molding, etc. The frame body 105 may be made of a thermoplastic resin containing, for example, polyamide as a main component. Alternatively, a thermosetting resin containing, for example, silicone as a main component may be used. Alternatively, other resin materials may be used. In molding the frame body 105, the through hole 111a of the die pad section 111 or the through hole 112a of the lead section 112 may be used as a gate for resin injection, so that the molding can be easily performed. Also, if lower edges of inner wall surfaces of the through hole 111a and the through hole 112a are exposed, solder fillets can be trapped when soldering is performed on the semiconductor device, so that the semiconductor device can be more firmly fixed by the anchoring effect.

The semiconductor element 103 is held in the element mounting section 114 of the die pad section 111 by using an adhesive (not shown), etc. When a back electrode (not shown) is provided on a back surface of the semiconductor element 103, the back electrode may be bonded to the element mounting section 114 by a conductive paste such as solder. In the present embodiment, the element mounting section 114 of the die pad section 111 spreads on both sides of the center line in the longitudinal direction of the frame body 105, and the semiconductor element 103 is disposed at the center of the region surrounded by the frame body 105. In the present embodiment, the entire semiconductor device including the external terminals 115 protruding outside the frame body 105 is axially symmetric, and thus the semiconductor element 103 is arranged at the center of the semiconductor device. A top electrode (not shown) is formed on an upper surface of the semiconductor element 103, and the top electrode is connected to the wire connection section 117 of the lead section 112 by the wire 109.

The protective resin 107 made of a transparent resin fills the region surrounded by the frame body 105. Thus, the semiconductor element 103 and the wire 109 are sealed. The protective resin 107 may be a resin containing, for example, silicone as a main component. The protective resin 107 may contain a fluorescent material which absorbs light emitted from the semiconductor element 103, and emits light having another wavelength.

Figure 2:
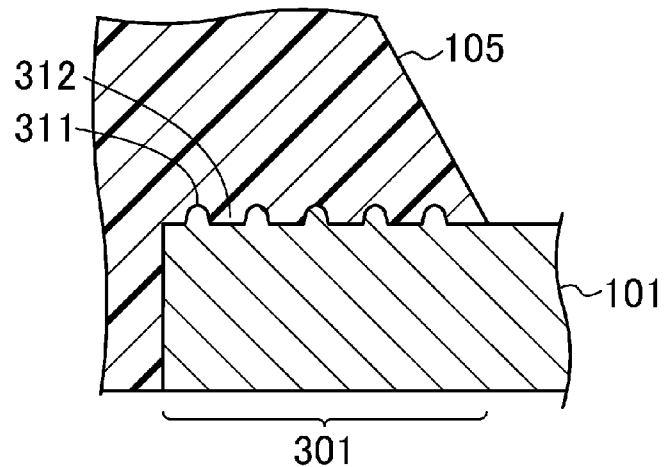
FIG. 2 is an enlarged cross-sectional view illustrating an upper surface section of a lead frame of the semiconductor device of the embodiment.

The semiconductor device of the present embodiment includes an uneven part formation section 301 in a section which is part of the upper surface of the lead frame 101 and is covered with the frame body 105. As illustrated in FIG. 2, the uneven part formation section 301 includes a plurality of protrusions 311 and a plurality of recesses 312. Forming the uneven part in the section which is part of the upper surface of the lead frame 101 and is covered with the frame body 105 increases the contact area between the lead frame 101 and the frame body 105, which can further improve joint strength. Thus, it is possible to reduce detachment of the lead frame 101 from the frame body 105 caused by expansion and contraction of the lead frame 101 and the frame body 105 due to heating and cooling during fabrication processes. Moreover, it is also possible to reduce detachment of the lead frame 101 from the frame body 105 caused by stress in mounting the semiconductor device to a mounting substrate. FIG. 2 illustrates an example in which sections which protrudes from the upper surface of the lead frame 101 are formed to form the uneven part. However, sections which are recessed from the upper surface of the lead frame 101 may be formed to form the uneven part.

Moreover, forming the uneven part can provide an obstacle on a passage along which the protective resin 107 moves at an interface between the lead frame 101 and the frame body 105, so that it is possible to reduce leakage of the protective resin 107. The uneven part can be easily formed by using a press die, or the like. The uneven part may be formed on the entire upper surface of the lead frame 101. However, for the adhesiveness between the semiconductor element 103 and the lead frame 101, and connectivity of the wire 109, surfaces of the element mounting section 114 of the lead frame 101, the wire connection section 117, and the like are preferably flat. Thus, the uneven part is preferably formed only in the section which is part of the upper surface of the lead frame 101 and is covered with the frame body 105.

Figure 3A:
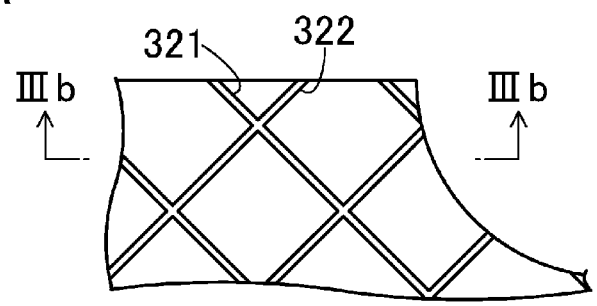
Figure 3B:
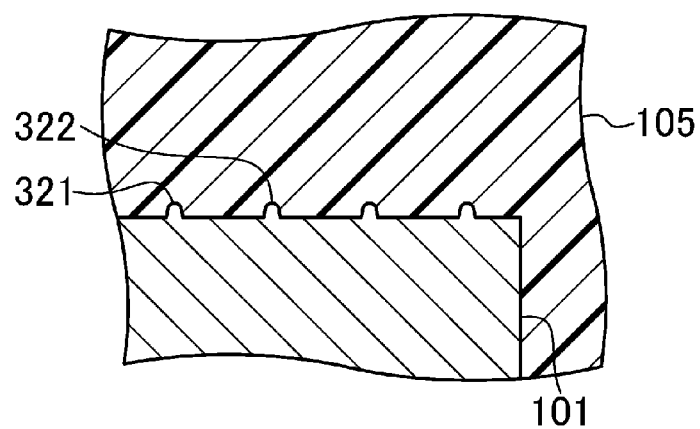

As illustrated in FIGS. 3A and 3B, the uneven part formed in the section which is part of the upper surface of the lead frame 101 and is covered with the frame body 105 may have a mesh structure including a plurality of first ridges 321 extending in a first direction, and a plurality of second ridges 322 extending in a second direction. When the uneven part has the mesh structure, it is possible to more effectively improve the joint strength and reduce the leakage of the protective resin. Preferably, the directions in which the first ridges 321 and the second ridges 322 extend do not orthogonally cross an outer circumference of the frame body 105. Thus, for example, the direction in which the first ridges 322 extend may be at 20-70° to the longest side of the frame body 105, and the direction in which the second ridges 322 extend may be orthogonal to the first ridges 321. The first ridges 321 are not necessarily orthogonal to the second ridges 322. Moreover, the first ridges 321 and the second protrusions 322 may each have a height of about 0.001-0.1 mm, and the first ridges 321 and the second ridges 322 may each have a width of about 0.005-0.1 mm. The interval between the first ridges 321 and the interval between the second ridges 322 may each be about 0.1-0.5 mm.

When the mesh structure is uniform in the entire section which is part of the lead frame 101 and is covered with the frame body 105, formation of the mesh structure is easy. When a mesh structure is formed by ridges or grooves crossing each other on the upper surface of the lead frame 101, the anchoring effect on stress in longitudinal, transverse, and diagonal directions can be expected. Moreover, forming the uneven part increases the area which is in contact with the frame body 105, so that a strong bonding can be achieved. Moreover, even when a gap, which may usually be a cause of the leakage of the protective resin 107, is formed in a bonding surface to the frame body 105, the protective resin 107 is less likely to leak outside because a surface area serves as a large and long passage due to the uneven part formed on the surface area.

On the other hand, stress applied to the lead frame 101 and the frame body 105 is not uniform, and the leakage of the protective resin 107 is a serious problem in some sections. Thus, the mesh structure may be varied depending on sections to further improve the adherence between the lead frame 101 and the frame body 105, and further improve the effect of reducing the leakage. For example, high stress is applied to the constricted section 116. Moreover, the contact area between the frame body 105 and the lead frame is small at corners of the constricted section 116. Moreover, the protective resin 107 which leaks via the constricted section 116 to the external terminal 115 is a serious problem. The greater the height and the width of the first ridges 321 and the second ridges 322 are, and smaller the interval between the first ridges 321 and the interval between the second ridges 322 are, the more the adherence between the lead frame 101 and the frame body 105 is improved. Moreover, it is possible to increase the length of the passage along which the protective resin 107 leaks. Thus, it is preferable that the height of the protrusions be increased, the width of the ridges be increased, and/or the interval between the ridges be reduced at the constricted section 116 compared to at the other sections of the lead frame 101. The height, the width, and the interval may all be varied, or some of them may be varied. Alternatively, the directions in which the first ridges 321 and the second ridges 322 extend may be adjusted depending on sections so that no trench which directly connects the region surrounded by the frame body 105 to the outside is formed.

The mesh structure formed by the ridges which are raised from the upper surface of the lead frame 101 has been illustrated. However, the mesh structure may be formed by trench sections which are recessed from the upper surface of the lead frame 101. The mesh structure formed by the trench sections can also provide advantages similar to those provided by the mesh structure formed by the ridges.

Figure 4A:
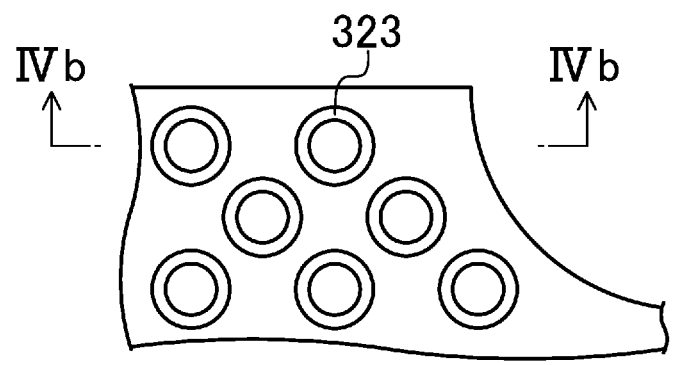
Figure 4B:
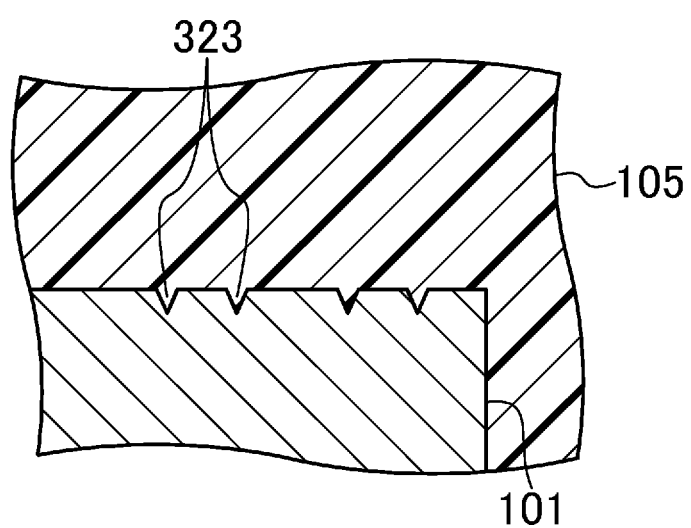

Moreover, as illustrated in FIGS. 4A and 4B, the uneven part formed in the section which is part of the upper surface of the lead frame 101 and is covered with the frame body 105 may include grooves 323 which are trenches each having the shape of a ring when viewed from above. In FIG. 4A, the grooves 323 are arranged in a staggered manner, but the grooves 323 may be arranged in a grid pattern, or may be arranged randomly. Note that when the grooves 323 are arranged in a staggered manner, the anchoring effect on stress, in particular, in the oblique direction can be expected, and thus high joint strength can be obtained.

Figure 5A:
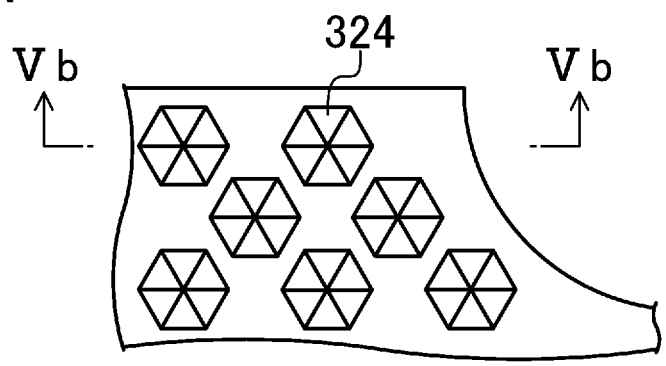
Figure 5B:
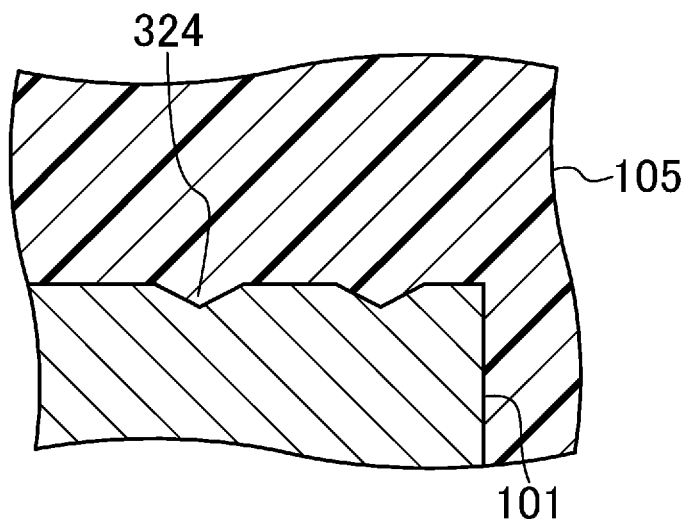

Moreover, as illustrated in FIGS. 5A and 5B, the uneven part formed in the section which is part of the upper surface of the lead frame 101 and is covered with the frame body 105 may include grooves 324 each having the shape of a hexagon when viewed from above. In FIG. 5A, the grooves 324 are arranged in a staggered manner, but the grooves 324 may be arranged in a grid pattern, or may be arranged randomly. When the grooves 324 are arranged in a staggered manner, the anchoring effect on stress, in particular, in the oblique direction can be expected, and thus high joint strength can be obtained. When the grooves 324 are arranged in a grid pattern, the anchoring effect on stress, in particular, in the longitudinal and transverse directions can be expected, and thus high joint strength can be obtained.

In FIG. 5B, the grooves 324 each having the shape of a hexagonal pyramid are illustrated, but the grooves 324 may each have the shape of a hexagonal prism. Note that forming each groove 324 to have the shape of a hexagonal pyramid is relatively easy, so that reliability can be improved. The shape of each groove 324 when viewed from above is not limited to a hexagon. Each groove 324 may have the shape of a polygon such as a triangle when viewed from above. In this case, each groove may have the shape of a prism or a pyramid in three-dimensional view. Alternatively, the shape of a frustum of pyramid may be possible. Alternatively, each groove 324 may have the shape of a circle when viewed from above, and the shape of a circular column, a circular cone, a frustum of circular cone, or a hemisphere in three-dimensional view.

Figure 6A:
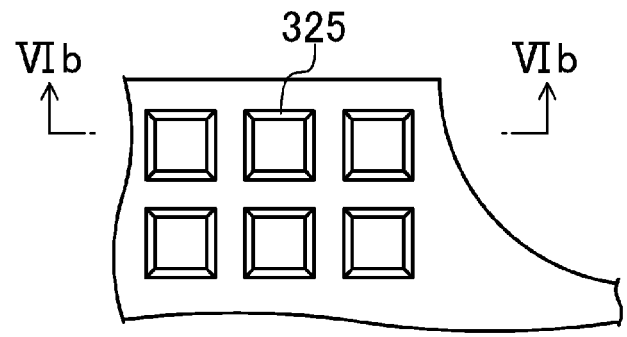
Figure 6B:
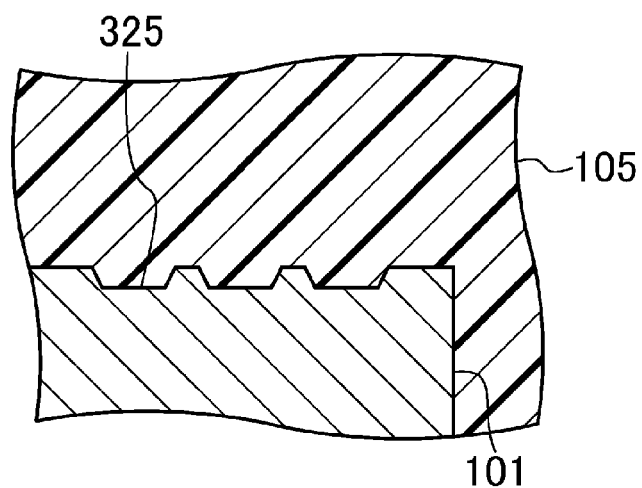

For example, as illustrated in FIGS. 6A and 6B, grooves 325 may have the shape of a rectangle when viewed from above, and the shape of a rectangular frustum. In FIG. 6A, the grooves 325 arranged in a grid pattern are illustrated. However, the grooves 325 may be arranged in a staggered manner, or may be arranged randomly. In FIG. 6B, the grooves 325 each have the shape of a rectangular frustum, but the grooves 325 may each have the shape of a rectangular pyramid or a rectangular prism. Note that forming the grooves 325 to have the shape of a rectangular frustum is relatively easy, and thus reliability can be further improved.

It is not necessary that all the grooves have the same shape, but grooves having different shapes may be arranged together. Moreover, it is not necessary that the grooves are arranged uniformly in all regions, but for example, there may be a region in which the grooves are arranged in a staggered manner and a region in which the grooves are arranged randomly. Alternatively, a mesh structure may include grooves formed in part of the uneven part, which is part of the upper surface of the lead frame 101 and is covered with the frame body 105, and ridges or trench sections formed in the rest of the uneven part.

Figure 7:
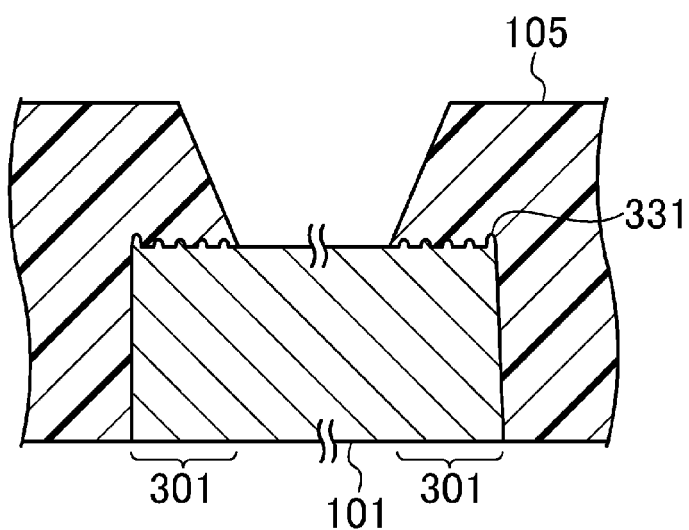
FIG. 7 is a cross-sectional view illustrating a variation of the semiconductor device of the embodiment.
Figure 8A:
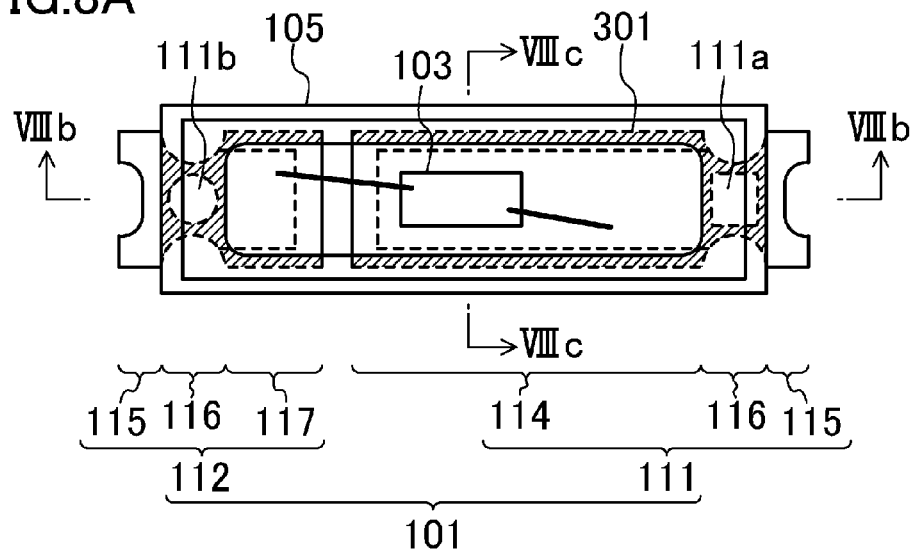
Figure 8B:
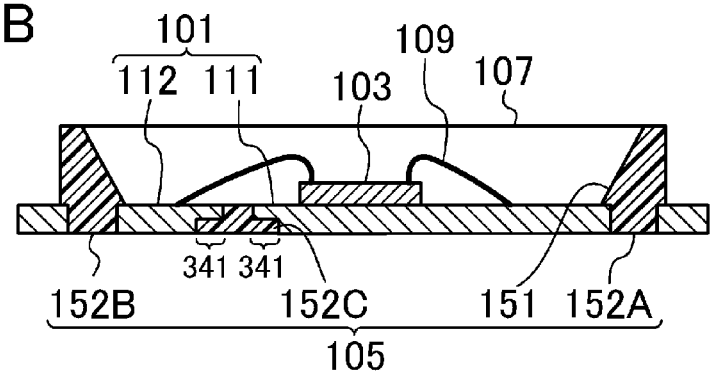
Figure 8C:
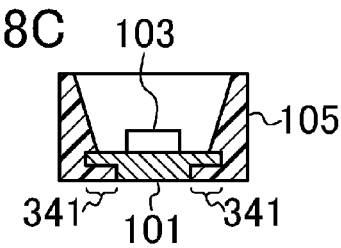
Figure 8D:
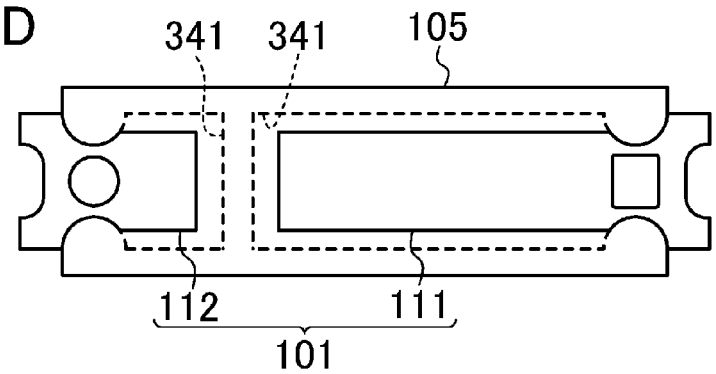

In order to further improve the adherence between the lead frame 101 and the frame body 105 and to further enhance the effect of reducing the leakage of the protective resin 107, as illustrated in FIG. 7, a barrier portion 331 which is raised from the upper surface of the lead frame 101 may be formed at the outer edge portion of the lead frame 101. Forming the barrier portion 331 at the outer edge portion of the lead frame 101 can further improve the adherence between the lead frame 101 and the frame body 105. Moreover, the barrier portion 331 increases the length of the passage of when the protective resin 107 leaks, so that the leakage of the protective resin 107 can further be reduced. The barrier portion 311 may be continuously formed at the outer edge portion of the lead frame 101 or may be selectively formed at necessary part of the outer edge portion.

When a base material is punched to form the outer circumference of the lead frame 101, the base material may be punched from an undersurface toward an upper surface thereof to form the barrier portion 331. When the base material is punched from the under surface toward the upper surface, an upward burr is formed at the outer edge portion of the lead frame 101. The barrier portion 331 can be easily formed by not performing a process of smoothing the burr. Alternatively, a plating layer may be formed to have a larger thickness at the outer edge portion of the lead frame 101 than at the other portions, or a barrier layer may be formed by bonding other materials. A sufficient height of the barrier portion 331 is about 1-100 μm. The greater the height is, the greater the effect is, but when the height is too great, formation of the barrier portion 331 becomes difficult. Also when the barrier portion 339 is the burr or formed by plating, the barrier portion having a height of about 10 μm can be easily formed. When the barrier portion 339 is the burr, the barrier portion having a height which is one thirtieth of the thickness of the lead frame 101 can be easily formed.

As illustrated in FIG. 8A-8D, at the outer edge portion of the lead frame 101, a thin portion 341 having a thickness smaller than the other portions of the lead frame 101 may be formed, and the frame body 105 may hold the thin portion 341. With this configuration, the contact area between the lead frame 101 and the frame body 105 is further increased, and mechanical strength is also increased. The thickness of the thin portion 341 may be between about two third to one third of the thickness of the other portion of the lead frame 101. Moreover, the thin portion 341 may have a width which allows the frame body 105 to vertically hold the lead frame 101, and the width of the thin portion 341 may be substantially the same as the width of the section of the lead frame 101 covered with the frame body 105. In FIGS. 8A-8D, the thin portion 341 continuously formed to surround the outer edge portions of the element mounting section 114 and the wire connection section 117 is illustrated, but the thin portion 341 may be formed divisionally. An uneven part such as a mesh structure may be formed at a back surface of the thin portion 341. In addition to providing the thin portion 341, the barrier portion 331 may also be formed at the outer edge portion. Moreover, the uneven part formation section 301 may have a mesh structure.

In the semiconductor device of the present embodiment, the die pad section 111 and the lead section 116 include the constricted sections 116, and the through hole 111a is formed in the constricted section 116 of the die pad section 111, and the through hole 112a is formed in the constricted section 116 of the lead section 112. In the through hole 111a and the through hole 112a, the buried portion 152A and the buried portion 152B of the frame body 105 are buried. Thus, the frame body 105 holds the die pad section 111 by the constricted section 116 and the buried portion 152A. Moreover, the frame body 105 holds the lead section 112 by the constricted section 116 and the buried portion 152B. This increases the joint strength of the frame body 105 to the die pad section 111 and to the lead section 112, and the frame body 105 is less easily detached from the lead frame 101.

When stress is applied in mounting the semiconductor device, the stress may cause detachment of the frame body 105 from the lead frame 101. In particular, the stress may cause deterioration in long-term reliability. Moreover, the lead frame 101 is distorted, which may cause variations in light distribution characteristics. Forming the constricted section 116 can provide the advantage of rendering the semiconductor device less susceptible to stress applied in mounting the semiconductor device to the mounting substrate. In a so-called one side sealing type package in which a back surface of the lead frame 101 is not covered with the frame body 105, a back surface of the element mounting section 114 of the die pad section 111 is generally adhered to the mounting substrate by an adhesive having high thermal conductivity such as solder so that heat is efficiently dissipated from the back surface of the lead frame 101. Moreover, soldering is also performed on the external terminal 115 of the die pad section 111 and the external terminal 115 of the lead section 112 for electrical connection. When a plurality of positions are fixed as in this case, it is not easy to perform a soldering process without causing distortion of the lead frame 101. The semiconductor device of the present embodiment includes the constricted sections 116 between the element mounting section 114 and the external terminal 115, and between an interconnect portion and the external terminal 115. Thus, stress applied to the semiconductor device can be absorbed by the constricted sections 116. Moreover, the buried portion 152C buried between the die pad section 111 and the lead section 112 has the effect of absorbing stress applied to the semiconductor device.

Forming the constricted sections and the through holes in the die pad section 111 and the lead section 112 can further improve the adherence between the lead frame 101 and the frame body 105, and stress applied to the lead frame can be reduced. Note that these structures may be provided when needed. Alternatively, only one of the die pad section 111 or the lead section 112 may have such a structure.

The example in which in the die pad section 111, the width of the external terminal 115 is equal to the width of the element mounting section 114 has been described. However, the width of the external terminal 115 may be larger than or smaller than the width of the element mounting section 114. Moreover, the width of the external terminal 115 in the lead section 112 may be larger than or smaller than the width of the wire connection section 117. The width of external terminal 115 in the die pad section 111 may be different from the width of the external terminal 115 in the lead section 112.

In light emitting elements, light receiving elements, etc., it is preferable in terms of optical characteristics that the semiconductor element 103 be mounted at the center of the region surrounded by the frame body 105. Thus, the die pad section 111 is preferably larger than the lead section 112, and an end section of the element mounting section 114 is preferably closer to the lead section 112 than the center of the frame body 105 is.

The example in which one semiconductor element is mounted on the lead frame has been illustrated, but a plurality of semiconductor devices may be mounted on the lead frame. Moreover, not only a semiconductor element but also a resistive element, a capacitive element, etc. may be mounted together. The example including two external terminals has been described, but a configuration including a plurality of lead sections and three or more external terminals may be possible. The semiconductor element is not limited to a light emitting element such as a light emitting diode, a super luminescence diode, a laser diode, etc., and a light receiving element, but may be other transistors, diodes, sensor elements, etc. The protective resin may be a light blocking material if necessary. Moreover, the semiconductor device in which the outer circumference of the frame body has the shape of a rectangle when viewed from above has been described, but the outer circumference of the frame body may have the shape of a square when viewed from above. Alternatively, the outer circumference of the frame body may have the shape of a polygon, a circle, an oval, an ellipse, etc.

The semiconductor device of the present disclosure has both a reduced size and improved heat dissipation characteristics, wherein leakage of a resin and detachment of the package are less likely to occur, and long-term reliability can be ensured. Thus, the semiconductor device of the present disclosure is useful particularly as surface mount type semiconductor devices.

What is claimed is:

1. A semiconductor device comprising:
a lead frame having an upper surface;
a semiconductor element held on the upper surface;
a frame body formed on and in contact with the upper surface to surround the semiconductor element when viewed from above; and
a protective resin which is provided in a region surrounded by the frame body and covers the semiconductor element, wherein
the upper surface has a contact region which is in contact with the frame body, and
the contact region has a protrusion or a recess respectively protruding from or being recessed from the upper surface as a reference surface.

2. The semiconductor device of claim 1, further comprising:
a plurality of protrusions or a plurality of recesses, wherein
the protrusion is included in the plurality of protrusions,
the recess is included in the plurality of recesses, and
each of the protrusions or each of the recesses has a shape of a ring when viewed from above.

3. The semiconductor device of claim 2, wherein the plurality of protrusions or the plurality of recesses are arranged in a staggered manner.

4. The semiconductor device of claim 2, wherein the plurality of protrusions or the plurality of recesses are arranged in a grid pattern.

5. The semiconductor device of claim 1, further comprising:
a plurality of protrusions or a plurality of recesses, wherein
the protrusion is included in the plurality of protrusions,
the recess is included in the plurality of recesses, and
each of the plurality of protrusions or each of the plurality of recesses has a shape of a polygon when viewed from above.

6. The semiconductor device of claim 5, wherein the plurality of protrusions or the plurality of recesses are arranged in a staggered manner.

7. The semiconductor device of claim 5, wherein the plurality of protrusions or the plurality of recesses are arranged in a grid pattern.

8. The semiconductor device of claim 1, wherein the protrusion or the recess is respectively a first ridge or a first groove linearly extending in a first direction.

9. The semiconductor device of claim 8, further comprising a second ridge or a second groove linearly extending in a second direction crossing the first ridge or the first groove, respectively.

10. The semiconductor device of claim 9, wherein extension lines of the first and second ridges and the first and second grooves do not orthogonally cross an outer circumference of the frame body.

11. The semiconductor device of claim 8, wherein the first ridge is provided in the contact region to continuously surround the semiconductor device when viewed from above.

12. The semiconductor device of claim 11, wherein the first ridge has a greater height from the upper surface as a reference surface than the other ridges.

13. The semiconductor device of claim 11, wherein the first ridge is provided along an outer edge portion of the lead frame.

14. The semiconductor device of claim 1, further comprising:
a plurality of protrusions or a plurality of recesses, wherein the protrusion is included in the plurality of protrusions, the recess is included in the plurality of recesses,
the lead frame has an element mounting section in which the semiconductor element is mounted, an external terminal, and a constricted section provided between the element mounting section and the external terminal and having a smaller width than the element mounting section, and
the protrusions in the contact region of the constricted section have a greater height from the upper surface as a reference surface, a larger width, or a narrower interval than the other protrusions in the contact region of the element mounting section, or the recesses in the contact region of the constricted section have a greater depth from the upper surface as a reference surface, a larger width, or narrower intervals than the other recesses in the contact region of the element mounting section.

15. The semiconductor device of claim 14, wherein
a through hole is formed in the constricted section, and
the frame body fills the through hole.

16. The semiconductor device of claim 14, wherein a thin portion thinner than the other portions of the lead frame is formed at an outer edge portion of the element mounting section to be flush with the upper surface.

17. The semiconductor device of claim 14, wherein the external terminal has a smaller width than the element mounting section.

18. The semiconductor device of claim 1, wherein
the lead frame includes a bottom surface facing the upper surface, and a side surface connecting the upper surface to the bottom surface, and
the side surface is covered with the frame body.

19. The semiconductor device of claim 1, wherein
the semiconductor element is a light-emitting diode, and
the protective resin contains a fluorescent material.

20. The semiconductor device of claim 1, wherein the recess does not extend completely through the lead frame.

* * * * *